US008333841B2

(12) United States Patent
Hayashi et al.

(10) Patent No.: US 8,333,841 B2
(45) Date of Patent: Dec. 18, 2012

(54) ROLL-TO-ROLL VACUUM DEPOSITION APPARATUS

(75) Inventors: Nobuhiro Hayashi, Chigasaki (JP); Tomoharu Fujii, Chigasaki (JP); Isao Tada, Chigasaka (JP); Atsushi Nakatsuka, Chigasaki (JP)

(73) Assignee: Ulvac, Inc., Kanagawa (JP)

( * ) Notice: Subject to any disclaimer, the term of this patent is extended or adjusted under 35 U.S.C. 154(b) by 912 days.

(21) Appl. No.: 12/374,675

(22) PCT Filed: Jul. 26, 2007

(86) PCT No.: PCT/JP2007/064639
§ 371 (c)(1),
(2), (4) Date: Apr. 20, 2009

(87) PCT Pub. No.: WO2008/018297
PCT Pub. Date: Feb. 14, 2008

(65) Prior Publication Data
US 2009/0320747 A1    Dec. 31, 2009

(30) Foreign Application Priority Data

Aug. 8, 2006  (JP) ................................. 2006-215259

(51) Int. Cl.
*C23C 16/00* (2006.01)
(52) U.S. Cl. ........................................ 118/718; 118/720
(58) Field of Classification Search .................. 118/718, 118/719, 720, 721, 726
See application file for complete search history.

(56) References Cited

U.S. PATENT DOCUMENTS

| | | | | |
|---|---|---|---|---|
| 5,178,678 A | * | 1/1993 | Koehler et al. | 118/46 |
| 5,350,598 A | * | 9/1994 | Kleyer | 427/255.5 |
| 6,082,257 A | * | 7/2000 | Secor | 101/137 |
| 6,106,627 A | * | 8/2000 | Yializis | 118/724 |
| 2010/0009082 A1 | * | 1/2010 | Hayaski et al. | 427/282 |

FOREIGN PATENT DOCUMENTS

| | | |
|---|---|---|
| EP | 1693481 A1 * | 8/2006 |
| JP | 0366664 | 6/1991 |
| JP | 4066155 A1 | 3/1992 |
| JP | 10081958 A | 3/1998 |

OTHER PUBLICATIONS

Priority PCT application IPRP dated Feb. 10, 2009.

* cited by examiner

*Primary Examiner* — Karla Moore
(74) *Attorney, Agent, or Firm* — Harness, Dickey & Pierce, PLC

(57) ABSTRACT

[Object] To provide a roll-to-roll vacuum deposition apparatus capable of easily and speedily adjusting a pressing force between a printing roller and a backup roller.

[Solving Means] In the present invention, by adjusting a pressing force between a printing roller and a backup roller through a relative movement of a mask forming unit including the printing roller and a transfer roller with respect to a vacuum chamber, individual adjustments of the printing roller and the transfer roller are eliminated and an adjustment of a pressing force on a unit basis is realized, thus achieving simplification of a structure, simplification and enhancement in precision of tasks, and a reduction in work time.

2 Claims, 4 Drawing Sheets

ROLL-TO-ROLL VACUUM DEPOSITION APPARATUS

FIELD

The present invention relates to a roll-to-roll vacuum deposition apparatus favorably used in producing, for example, a self-protection-function-type film capacitor.

BACKGROUND

From the past, a roll-to-roll vacuum vapor deposition apparatus that deposits, while paying out an insulation film such as a plastic film from a payout roller, a metal layer onto a surface of the film and taking up the film by a take-up roller thereafter is used in producing a film capacitor.

Incidentally, the film capacitor of this type includes a self-protection-function type in which a metal deposition layer formed on a surface of a film is fragmented into a plurality of capacitor pieces, and the adjacent capacitor pieces are mutually connected at a junction portion that is formed of the same deposition layer and has a narrow width. In the film capacitor of this type, the junction portion is fused when an insulation breakdown occurs in a part of the film capacitor (fuse function) so that an insulation breakdown area of the capacitor is suppressed at minimum on an individual piece basis.

When producing such a self-protection-type film capacitor by the roll-to-roll vacuum vapor deposition apparatus described above, a mask forming means for forming a mask pattern that defines a deposition area of the metal layer with respect to a deposition surface of the film is interposed between the payout roller and an evaporation source (see, for example, Patent Document 1 below).

As the mask forming means, while nipping the film between a printing roller (plate cylinder) and a backup roller (impression cylinder) and conveying it, an oil for forming a mask pattern that has been transferred onto the printing roller from an oil supply source via a transfer roller is successively transferred onto the deposition surface of the film from the printing roller. Accordingly, self-protection-function-type film capacitors each having a capacitor piece in an arbitrary shape are produced successively.

Meanwhile, in a roll-to-roll vacuum vapor deposition apparatus of the related art, the printing roller and the transfer roller have been provided to a member fixed in the vacuum chamber. Further, such a roller group has been adjusted in the atmosphere, and the vacuum chamber has been exhausted thereafter.

However, the vacuum chamber is deformed to some extent when a pressure inside is reduced. In particular, recent vacuum chambers are increased in size, with a tendency that a deformation amount of the vacuum chamber at a time of exhaustion increases. A positional accuracy of a mask forming unit is required to be $\frac{1}{100}$ mm or less, but a deformation of the vacuum chamber may be caused in an order of about 1 mm. Therefore, even when the roller group of the mask forming unit is adjusted in the atmosphere, the influence of the deformation may affect pattern formation. Thus, it has been necessary to adjust the roller group in consideration of the deformation amount and repeatedly perform the adjustment in the atmosphere and a post-exhaustion check, thus resulting in an increase in the number of processes.

Patent Document 1: Japanese Patent Application Laid-open No. Hei 10-81958

SUMMARY

Problems to be Solved by the Invention

In forming a mask pattern by the mask forming means described above, a pressing force balance between the printing roller and the backup roller in the film width direction becomes important. When the balance of the pressing force between those rollers is poor, transfer accuracy on one end side and that on the other end side regarding the film width direction become different, to thus induce a transfer failure such as pattern breakage in some cases.

In this regard, Patent Document 1 above discloses a method involving providing a press-driving means to each of the printing roller and the transfer roller constituting the mask forming means, and individually adjusting the pressing force between the transfer roller and the printing roller and that between the printing roller and the backup roller.

By the method of individually adjusting the pressing fore between the printing roller and the transfer roller, however, there is a problem that a task becomes complex and the work time is elongated. There is also a problem that a structure of the mask forming means becomes complex.

The present invention has been made in view of the above-mentioned problems, and therefore has an object to provide a roll-to-roll vacuum deposition apparatus capable of easily and speedily adjusting a pressing force balance between a printing roller and a backup roller.

Means for Solving the Problems

To solve the problems above, a roll-to-roll vacuum deposition apparatus according to the present invention is characterized in that a mask forming means for forming a mask pattern that defines a deposition area of a deposition material on a deposition surface of a film includes a mask forming unit including a supply source for an oil for forming the mask pattern, a first roller for holding the oil supplied from the supply source at an outer circumference, and a second roller for transferring the oil onto the deposition surface of the film as the mask pattern, a backup roller for nipping the film with the second roller and causing the film to come into pressure-contact with the second roller, and a unit moving mechanism for moving the mask forming unit with respect to a vacuum chamber; and the unit moving mechanism moves a position of the mask forming unit with respect to the backup roller and adjusts a balance of a pressure contact force between the second roller and the backup roller in a width direction of the film.

In the present invention, the second roller corresponds to the printing roller. By adjusting the pressing force balance between the second roller and the backup roller in the film width direction through the relative movement of the mask forming unit including the first roller and the second roller with respect to the vacuum chamber, individual adjustments of the first roller and the second roller are eliminated and an adjustment of the pressing force balance on a unit basis is realized, thus achieving simplification of tasks and a reduction in work time.

Moreover, in the present invention, the mask forming unit includes a frame for supporting both ends of a shaft of the first roller and both ends of a shaft of the second roller, the frame is movably disposed on a pedestal fixed to the vacuum chamber, and the unit moving mechanism moves at least one end of the frame in a direction of the backup roller. Accordingly, the structure can be simplified, and it also becomes possible to easily and speedily adjust the pressing force balance between the second roller and the backup roller in the film width direction while enabling an adjustment of parallelism of the shaft of the second roller with respect to the backup roller. Preferably, the frame is capable of moving rotationally about a point on the pedestal.

Furthermore, because the unit moving mechanism can be operated remotely from outside the vacuum chamber, an adjustment of the mask forming unit after exhaustion can also be carried out with ease.

Effect of the Invention

According to the roll-to-roll vacuum deposition apparatus of the present invention, a pressing force balance between the printing roller and the backup roller can be easily and speedily adjusted.

BRIEF DESCRIPTION OF DRAWINGS

FIG. 2 are diagrams each showing an example of a mask pattern formed by a mask forming unit in the roll-to-roll vacuum vapor deposition apparatus shown in FIG. 1, in which

FIG. 4 are diagrams showing a structure of the mask forming unit shown in FIG. 3, in which

DETAILED DESCRIPTION

Hereinafter, an embodiment of the present invention will be described with reference to the drawings. In this embodiment, descriptions will be given on an example where the present invention is applied to a roll-to-roll vacuum vapor deposition apparatus as a roll-to-roll vacuum deposition apparatus.

Figure 1:
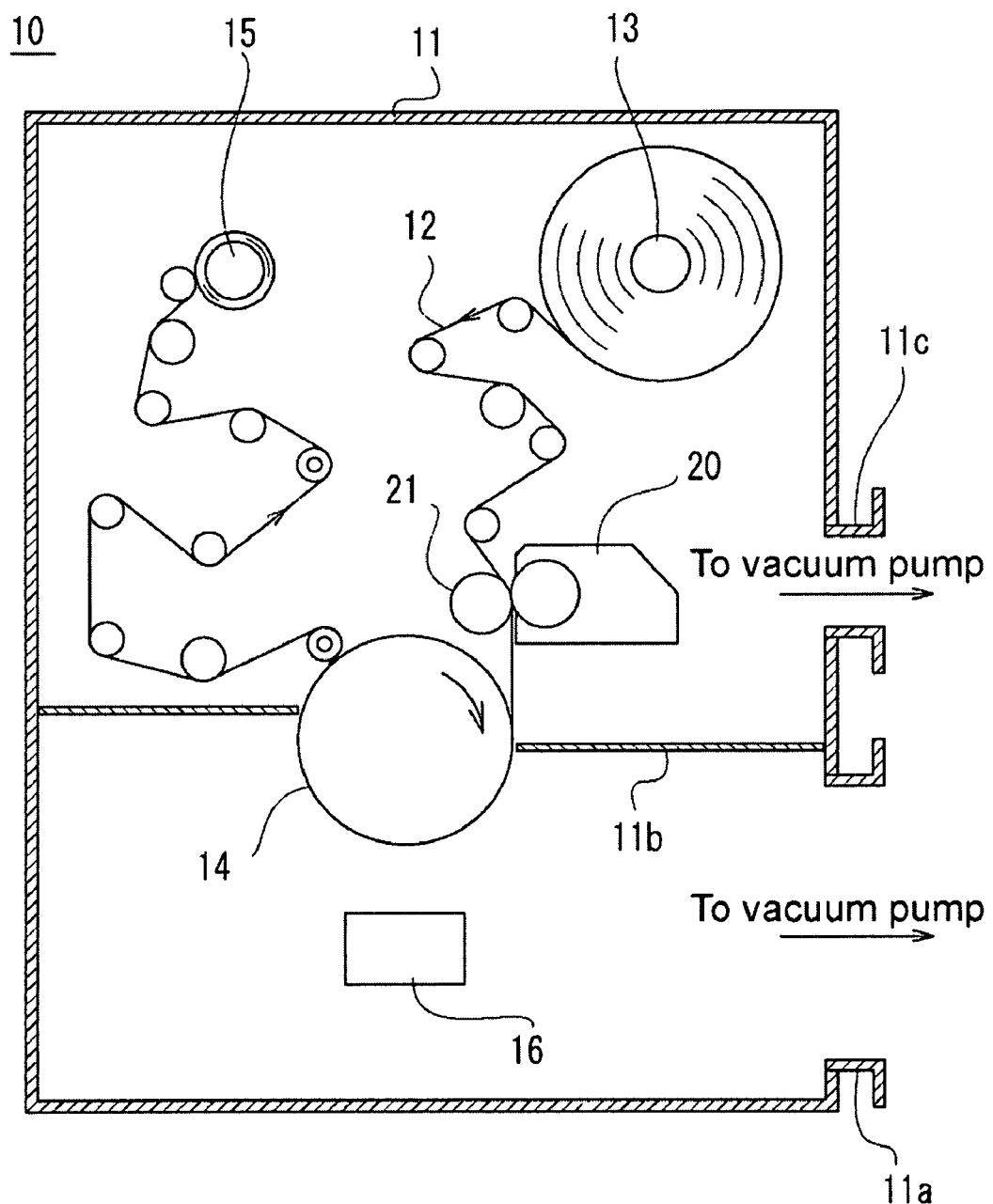
FIG. 1 is a schematic structural diagram of a roll-to-roll vacuum vapor deposition apparatus as a roll-to-roll vacuum deposition apparatus according to an embodiment of the present invention.

FIG. 1 is a schematic structural diagram of a roll-to-roll (take-up-type) vacuum vapor deposition apparatus 10 according to the embodiment of the present invention. The roll-to-roll vacuum vapor deposition apparatus 10 of this embodiment includes a vacuum chamber 11, a payout roller 13 for a film 12, a cooling can roller 14, a take-up roller 15 for the film 12, and an evaporation source (corresponding to a "depositing means" of the present invention) 16 of an evaporation material.

The vacuum chamber 11 is connected to a vacuum exhaust system such as a vacuum pump (not shown) via a pipe connection portion 11a, and is exhausted to reduce a pressure inside to a predetermined vacuum degree. An internal space of the vacuum chamber 11 is sectioned by a partition plate 11b into a room in which the payout roller 13, the take-up roller 15, and the like are disposed, and a room in which the evaporation source 16 is disposed.

The film 12 is constituted of a long plastic film having an insulation property and cut at a predetermined width. For example, an OPP (oriented polypropylene) film, a PET (polyethylene terephthalate) film, or a PPS (polyphenylene sulfide) film is used. The film 12 is paid out from the payout roller 13 and is taken up by the take-up roller 15 via a plurality of guide rollers and the can roller 14. It should be noted that although not shown, each of the payout roller 13 and the take-up roller 15 is provided with a rotary drive portion.

The can roller 14 is tubular and made of metal such as iron. Inside, the can roller 14 has a cooling mechanism such as a cooling medium circulation system, a rotary drive mechanism for rotationally driving the can roller 14, and the like. The film 12 is wound around a circumferential surface of the can roller 14 at a predetermined holding angle. The film 12 wound around the can roller 14 is deposited with, on a deposition surface on an outer surface side thereof, an evaporation material from the evaporation source 16 so as to form a deposited layer, and at the same time, is cooled by the can roller 14.

The payout roller 13, the can roller 14, the take-up roller 15, and the other guide rollers above constitute a "traveling means" of the present invention for causing the film 12 to travel inside the vacuum chamber 11.

The evaporation source 16 accommodates the evaporation material and has a mechanism for causing the evaporation material to evaporate by heating using a well-known technique such as resistance heating, induction heating, and electron beam heating. The evaporation source 16 is disposed below the can roller 14 and causes the vapor of the evaporation material to adhere onto the film 12 on the can roller 14 opposed thereto, to thus form a deposited layer. It should be noted that the evaporation source 16 corresponds to a "depositing means" of the present invention for depositing a deposition material onto the traveling film 12.

As the evaporation material, in addition to a metal element single body such as Al (aluminum), Co (cobalt), Cu (copper), Ni (nickel), and Ti (titanium), two or more metals such as Al—Zn (zinc), Cu—Zn, and Fe (iron)-Co, or a multi-component alloy is applicable. In addition, the number of evaporation source 16 is not limited to one, and a plurality of evaporation sources may be provided.

The roll-to-roll vacuum vapor deposition apparatus 10 of this embodiment additionally includes a mask forming unit 20. The mask forming unit 20 is disposed upstream of the evaporation source 16, that is, between the payout roller 13 and the evaporation source 16 (can roller 14). The mask forming unit 20 constitutes a "mask forming means" of the present invention together with a backup roller 21 to be described later.

Figure 2A:
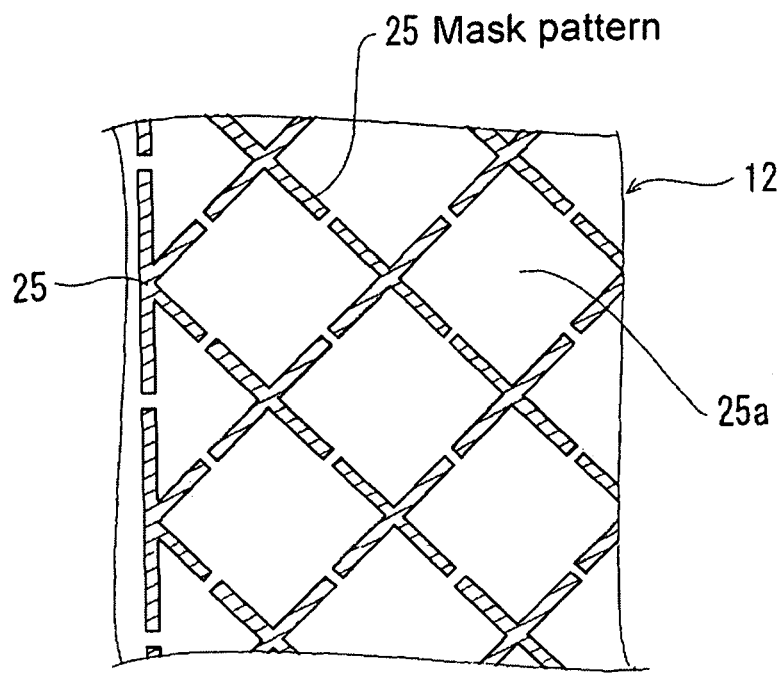
FIG. 2A shows a state prior to deposition of a metal layer.

FIG. 2 each show the deposition surface of the film 12. The mask forming unit 20 is structured so that a mask pattern (oil pattern) 25 in a form indicated by the hatching in FIG. 2A, for example, is applied onto almost the entire surface of the deposition surface of the film 12. Because a metal layer is not deposited on the mask pattern 25, after the deposition, a metal layer 26 in a form in which substantially-rectangular metal patterns obtained by depositing the evaporation material onto openings 25a of the mask pattern 25 are connected at a predetermined pitch via junction portions 26a is deposited. It should be noted that the form in which the metal layer 26 is deposited is not limited to that described above.

It should be noted that each of the metal patterns constitutes a capacitor piece and functions as a self-protection-function-type film capacitor in which the junction portion 26a is fused when an insulation breakdown occurs in a part of the film capacitor so that an insulation breakdown area of the capacitor is suppressed at minimum on an individual piece basis.

Figure 3:
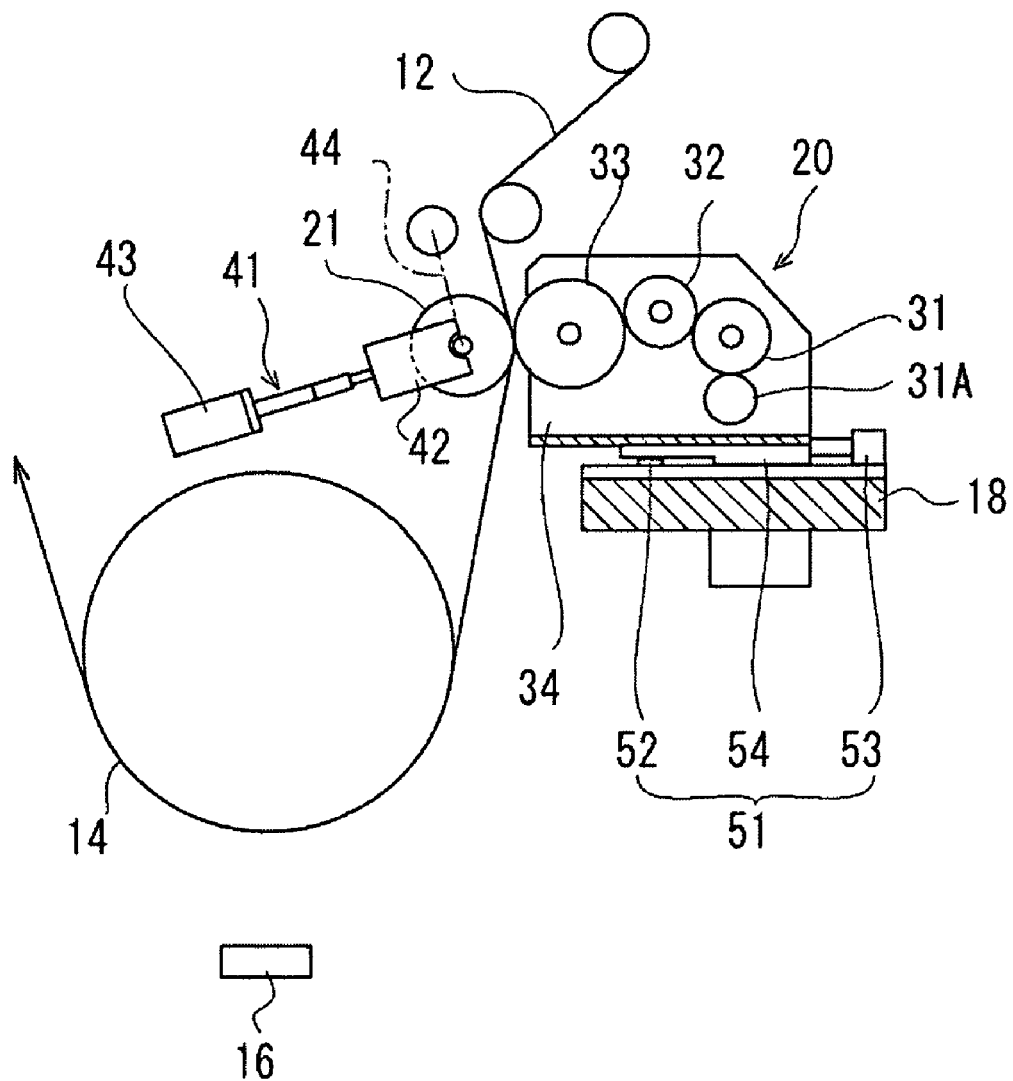
FIG. 3 is a schematic side view of the mask forming unit of the roll-to-roll vacuum vapor deposition apparatus shown in FIG. 1.

FIG. 3 is a schematic structural diagram of the mask forming unit 20. The mask forming unit 20 includes an oil injection source 31A, an oil supply roller 31 such as an Anilox roller, a transfer roller (first roller) 32 for holding the oil supplied from the oil supply roller 31 at an outer circumference, and a printing roller (second roller) 33 onto which the oil is transferred from the transfer roller 32 and that transfers the oil onto the deposition surface of the film 12 as the mask pattern 25. It should be noted that the oil injection source 31A and the oil supply roller 31 constitute a "supply source for an oil" of the present invention. It should also be noted that the oil supply source may be constituted only of the oil injection source 31A.

The transfer roller 32 is supplied with a predetermined amount of oil from the oil supply roller 31, and transfers the supplied oil onto the printing roller 33. A convex plate corresponding to the mask pattern 25 is formed on a surface of the printing roller 33, and the oil transferred onto the convex plate is transferred onto the deposition surface of the film 12 so as to form the mask pattern 25. The printing roller 33 has a shaft length longer than a width dimension of the film 12.

The oil injection source 31A and both ends of the shaft of each of the oil supply roller 31, the transfer roller 32, and the printing roller 33 are supported by a common frame body 34. Further, although not shown, the frame body 34 is provided with a driving unit for rotationally driving the oil supply roller 31, the transfer roller 32, and the printing roller 33. The frame body 34 constitutes a bottom portion and wall portions on both sides of the mask forming unit 20, and the bottom portion of the frame body 34 is disposed on a pedestal 18 attached on a part of an inner wall surface of the vacuum chamber 11 via a unit moving mechanism 51 to be described later.

Meanwhile, the backup roller 21 nips the film 12 with the printing roller 33 and causes the film 12 to come into pressure-contact with the printing roller 33. The backup roller 21 is provided with a biasing mechanism 41 for biasing the backup roller 21 toward the printing roller 33. The biasing mechanism 41 includes a biasing tool 42 for supporting both ends of a shaft portion of the backup roller 21 and a driving motor 43 for biasing the biasing tool 42 toward the printing roller 33. It should be noted that the backup roller 21 is attached swingably to a part of the vacuum chamber 11 via a supporting arm 44.

The roll-to-roll vacuum vapor deposition apparatus 10 of this embodiment includes a unit moving mechanism 51 for relatively moving the mask forming unit 20 with respect to the pedestal 18 and adjusting a pressing force balance between the printing roller 33 and the backup roller 21 in a width direction of the film 12.

Figure 4A:
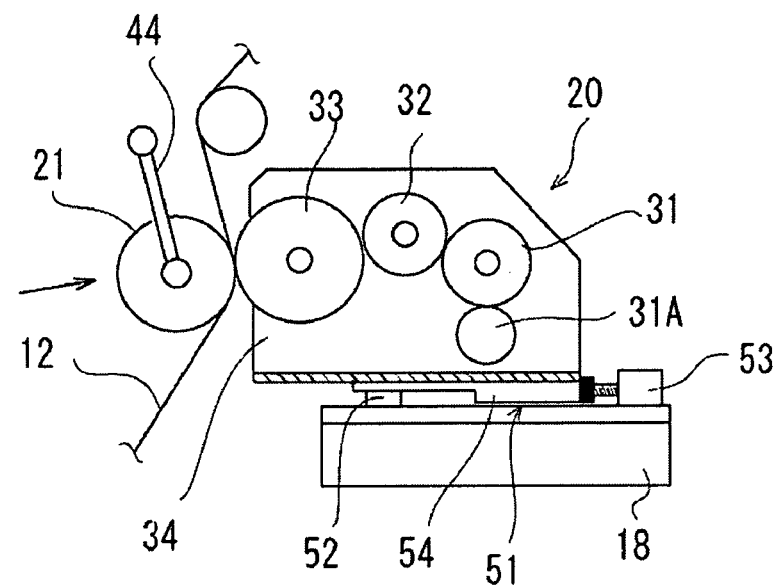
FIG. 4A is a side view and FIG. 4B is a plan view thereof.
Figure 4B:
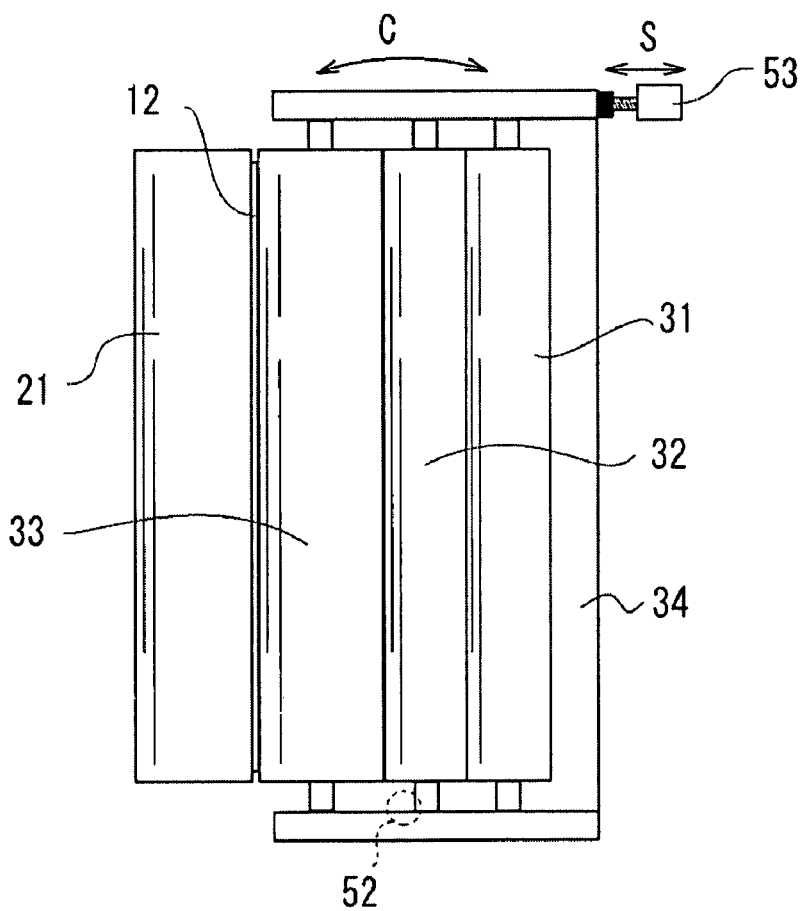

FIG. 4 are diagrams showing a structure of the unit moving mechanism 51, in which FIG. 4A is a schematic side view and FIG. 4B is a plan view thereof. The unit moving mechanism 51 includes a rotary shaft 52 disposed between the pedestal 18 and the mask forming unit 20, a driving source 53 for rotating the mask forming unit 20 about the rotary shaft 52, and a guide portion 54 for guiding a movement of the mask forming unit 20 with respect to the pedestal 18. As shown in FIG. 4B, the rotary shaft 52 is provided on one end side of the frame body 34 (one end side in an axial direction of the printing roller 33), and the driving source 53 is fixed on the pedestal 18 so that the other end side of the mask forming unit 20 can be driven forwardly and backwardly as indicated by an arrow S.

The driving source 53 is constituted of a fine feeding mechanism such as a stepping motor and a ball screw unit, and rotationally moves the frame body 34 about a point (rotary shaft 52) on the pedestal 18 in a direction indicated by an arrow C. It should be noted that a position at which the rotary shaft 52 is disposed is not limited to the example above, but accuracy in rotation control becomes higher as a distance between the rotary shaft 52 (fulcrum) and the driving source 53 (operating point) increases.

Next, descriptions will be given on an operation of the roll-to-roll vacuum vapor deposition apparatus 10 of this embodiment structured as described above.

Inside the vacuum chamber 11 pressure-reduced to a predetermined vacuum degree, the film 12 successively paid out from the payout roller 13 is subjected to the mask forming process and the vapor deposition process to thereafter be successively taken up by the take-up roller 15.

Figure 2B:
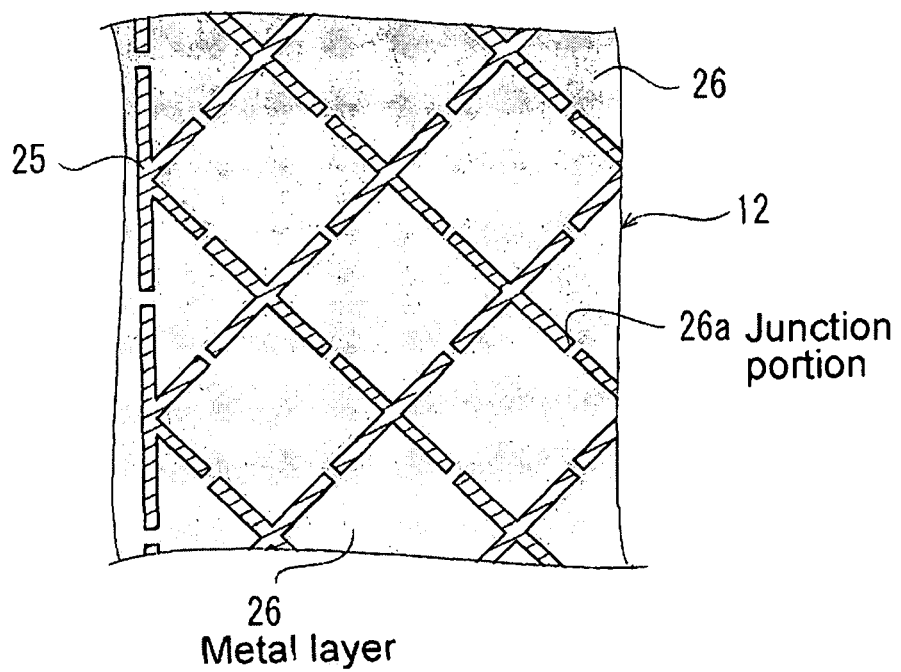
FIG. 2B shows a state after the deposition.

In the mask forming process, the mask pattern 25 in the form shown in FIG. 2A is printed on the deposition surface of the film 12 by the mask forming unit 20. The film 12 on which the mask pattern 25 has been formed is wound around the can roller 14. It should be noted that, if necessary, processing for enhancing an adhesive force with respect to the can roller 14, such as irradiation of charged particle beams including electron beams onto the film 12, may be carried out. By depositing the evaporation material that has evaporated from the evaporation source 16 onto the deposition surface of the film 12, the metal layer 26 shown in FIG. 2B is formed. The film 12 on which the metal layer 26 has been deposited is taken up by the take-up roller 15 via the guide roller.

Here, for forming the mask pattern 25 by the mask forming unit 20, a pressing force balance between the printing roller 33 and the backup roller 21 nipping the traveling film 12, in the film width direction becomes important. When the balance of the pressing force between those rollers is poor, transfer accuracy of the oil pattern on one end side and that on the other end side regarding the width direction of the film 12 become different, to thus induce pattern breakage in a worst case. Such a problem is caused due to lowering of parallelism between shafts of the printing roller 33 and the backup roller 21, so it is necessary to highly-accurately adjust the shaft position of the printing roller 33 with respect to the backup roller 21.

In this regard, because the mask forming unit 20 is disposed to be rotatable with respect to the pedestal 18 that partially constitutes the vacuum chamber 11 in this embodiment, it is possible to adjust the pressing force while changing the shaft position of the printing roller 33 with respect to the backup roller 21 by feed drive of the driving source 53, and highly-accurately adjust the parallelism between the shafts of those rolls 21 and 33. It should be noted that because the backup roller 21 is constantly pressed toward the printing roller 33 side by the biasing mechanism 41, a force of the printing roller 33 in nipping the film 12 does not change at the time of adjustment of the shaft position.

Moreover, in this embodiment, because the pressing force between the printing roller 33 and the backup roller 21 is adjusted through the relative movement of the entire mask forming unit 20 including the printing roller 33 and the transfer roller 32 with respect to the vacuum chamber 11, individual adjustments of the printing roller 33 and the transfer roller 32 are eliminated and a pressing force adjustment on a unit basis can be realized, thus achieving simplification of a structure and tasks and a reduction in work time.

Furthermore, it is also possible to structure the driving source 53 so as to be capable of being operated remotely from outside the vacuum chamber 11. In this case, the adjustment of the mask forming unit 20 after exhaustion can be carried out with ease. For example, it also becomes possible to easily and speedily readjust the pressing force balance between the printing roller 33 and the backup roller 21 after the exhaustion, to thus improve productivity.

It should be noted that the frame body 34 of the mask forming unit 20 is disposed to be movable with respect to the pedestal 18 or fixed only by the rotary shaft 52, thus being hardly affected by the deformation of the vacuum chamber 11. Therefore, it is possible to suppress, even when the vacuum chamber 11 is exhausted after the adjustment of the mask forming unit 20 in the atmosphere, a fluctuation in the pressing force balance between the printing roller 33 and the backup roller 21.

Heretofore, the embodiment of the present invention has been described. However, the present invention is of course not limited thereto and can be variously modified based on the technical idea of the present invention.

In the above embodiment, for example, the unit moving mechanism 51 has a structure in which the rotary shaft 52 is provided on one end side of the mask forming unit 20 and the driving source 53 is connected to the other end side. However, it is also possible that, instead, the driving source is provided on both end sides of the mask forming unit 20, and the driving sources are driven and controlled to adjust the position of the mask forming unit 20, to thereby optimize the pressing force balance between the backup roller 21 and the printing roller 33.

Moreover, it is also possible to employ a form of control in which a process of checking the mask pattern 25 is added on a guide path of the film 12, and a result of the check is fed back to the unit moving mechanism 51 of the mask forming unit 20, to thus optimize the shaft position of the printing roller 33.

It should be noted that in the above embodiment, descriptions have been given on the example where the metal layer is deposited by applying the vapor deposition method that uses the evaporation source 16 as the depositing means. However, the present invention is of course not limited thereto, and other deposition methods for depositing a metal layer or a nonmetal layer, such as a sputtering method or various CVD methods are also applicable, and a depositing means such as a sputtering target can be employed as appropriate based on those deposition methods.

What is claimed is:

1. A roll-to-roll vacuum deposition apparatus comprising:
a vacuum chamber;
a traveling means for causing a film to travel inside the vacuum chamber;
a depositing means for depositing a deposition material on the traveling film; and
a mask forming means disposed upstream of the depositing means, for forming a mask pattern that defines a deposition area of the deposition material on the film,
wherein the mask forming means includes:
a mask forming unit including a supply source for an oil for forming the mask pattern, a first roller for holding the oil supplied from the supply source at an outer circumference, and a second roller for transferring the oil onto a deposition surface of the film as the mask pattern, and a frame having a first end portion respectively supporting first ends of the first and second rollers and a second end portion respectively supporting second ends of the first and second rollers;
a backup roller for nipping the film with the second roller and causing the film to come into pressure-contact with the second roller;
a biasing mechanism for biasing the backup roller toward the second roller; and
a unit moving mechanism having a pedestal secured to the vacuum chamber and supporting the frame movably, a rotary shaft provided between the pedestal and the first end portion of the frame and a driving source fixed on the pedestal and configured to be capable of moving the second end portion of the frame toward the backup roller, the unit moving mechanism for rotationally moving a position of the mask forming unit about the rotary shaft with respect to the backup roller by the driving source and adjusting a balance of a pressure contact force between the second roller and the backup roller in a width direction of the film.

2. The roll-to-roll vacuum deposition apparatus according to claim 1, wherein the unit moving mechanism can be operated remotely from outside the vacuum chamber.

* * * * *